(12) United States Patent
Raley et al.

(10) Patent No.: US 9,165,765 B1
(45) Date of Patent: Oct. 20, 2015

(54) METHOD FOR PATTERNING DIFFERING CRITICAL DIMENSIONS AT SUB-RESOLUTION SCALES

(71) Applicant: Tokyo Electron Limited, Minato-ku, Tokyo (JP)

(72) Inventors: Angelique D. Raley, Mechanicville, NY (US); Akiteru Ko, Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/481,136

(22) Filed: Sep. 9, 2014

(51) Int. Cl.
 *H01L 21/4763* (2006.01)
 *H01L 21/02* (2006.01)
 *H01L 21/223* (2006.01)

(52) U.S. Cl.
 CPC ........ *H01L 21/0234* (2013.01); *H01L 21/2236* (2013.01)

(58) Field of Classification Search
 CPC .................. H01L 21/0234; H01L 21/2236
 USPC .................................................. 438/636
 See application file for complete search history.

(56) References Cited

U.S. PATENT DOCUMENTS

| | | | |
|---|---|---|---|
| 6,844,265 | B2 | 1/2005 | Ouchi |
| 7,977,249 | B1 * | 7/2011 | Liu et al. .......... 438/724 |
| 8,383,522 | B2 | 2/2013 | Nakajima |

* cited by examiner

*Primary Examiner* — David S Blum
(74) *Attorney, Agent, or Firm* — Wood, Herron & Evans, LLP (57) ABSTRACT

Techniques include a plasma oxidation treatment to modify a material to a predetermined thickness around a mandrel or spacer or other structure. This plasma oxidation is then followed by a chemical oxide removal treatment. With only a portion of the structures being oxidized, or by selective masking a portion of oxidized structures, the chemical oxide removal treatment essentially shrinks only a portion of the structures, thereby yielding structures having differing critical dimensions which can function as etch masks to transfer patterns into one or more underlying layers. Accordingly, structures having differing critical dimensions can be fabricated at sub-resolution scales.

20 Claims, 8 Drawing Sheets

METHOD FOR PATTERNING DIFFERING CRITICAL DIMENSIONS AT SUB-RESOLUTION SCALES

BACKGROUND OF THE INVENTION

This disclosure relates to substrate processing, and, more particularly, to techniques for patterning substrates including semiconductor wafers.

Fabricating structures on semiconductor wafers typically involves patterning a photoresist film by lithographic exposure, developing the photoresist film using various chemical developers to generate a relief pattern, and then transferring the relief pattern defined by the resist film into one or more underlying layers using an etch process. The semiconductor industry is constantly advancing electronic devices, which means structures and features on wafers are continually shrinking. Methods of shrinking line-widths in lithographic processes have historically involved using greater-NA optics, shorter exposure wavelengths, or interfacial media other than air (e.g., water immersion). As the resolution of conventional lithographic processes has approached theoretical limits, manufacturers have started to turn to double-patterning (DP) methods to overcome optical limitations.

In material processing methodologies (such as photolithography), creating patterned layers comprises the application of a thin layer of radiation-sensitive material, such as photoresist, to an upper surface of a substrate. This radiation-sensitive material is transformed into a patterned mask that can be used to etch or transfer a pattern into an underlying layer on a substrate. Patterning of the radiation-sensitive material generally involves exposure by a radiation source through a reticle (and associated optics) onto the radiation-sensitive material using, for example, a photolithography system. This exposure can then be followed by the removal of irradiated regions of the radiation-sensitive material (as in the case of positive photoresist), or non-irradiated regions (as in the case of negative resist) using a developing solvent. This mask layer may comprise multiple sub-layers.

Conventional lithographic techniques for exposing a pattern of radiation or light onto a substrate have various challenges that limit a size of features exposed, and limit pitch or spacing between exposed features.

SUMMARY

One challenge with patterning semiconductor substrates is that of simultaneously fabricating structures having differing critical dimensions. This is especially true with sub-resolution dimensions. In situations in which two different critical dimensions of a given design specification are well within limitations of conventional photolithography, then a reticle mask can be used to create the structures of differing dimensions. If, however, at least one critical dimension specified in a pair of critical dimensions is smaller than the patterning capability of a given conventional photolithography system, then the photolithography system cannot be used to accurately pattern a substrate. To pattern beyond the optical limitations of conventional lithography systems, double patterning techniques have been used. Such double patterning techniques can include sidewall image transfer, self-aligned double patterning, and so forth.

Although double patterning techniques can shrink critical dimensions below optical limitations, the shrinking is uniform across a wafer. Thus, such double patterning techniques do not enable patterning of multiple different critical dimensions. For example, double patterning techniques typically involve depositing a spacer around a mandrel, removing the mandrel, and then transferring a pattern defined by spacers into an underlying layer. The spacer, however, is deposited initially as a conformal film. Conformal films have a uniform thickness on all surfaces (horizontal and vertical), that is, a same critical dimension results in all places. This means that if a given device design specifies having multiple different dimensions, such differing dimensions cannot be achieved by double patterning alone. By way of a non-limiting example, given device designs can specify creating gates and/or fins, which should be created simultaneously (or approximately simultaneously) to achieve high throughput. Accordingly, patterning of structures having differing critical dimensions is especially challenging as device designs specify fins and gates at 14 nm, 10 nm, and below. One conventional technique involves depositing oxide spacers using a furnace, but such a technique increases a critical dimension making a thicker spacer instead of narrowing one group of structures. Moreover, furnace oxidation is relatively slow and difficult to accurately and uniformly control.

Techniques herein use a plasma oxidation treatment to modify a material to a predetermined thickness around a mandrel or spacer or other structure. This plasma oxidation treatment is then followed by a chemical oxide removal treatment. With only a portion of the structures being oxidized—or by covering a portion of oxidized structures—the chemical oxide removal treatment essentially shrinks only a portion of the structures, thereby yielding structures having differing critical dimensions. These structures or lines of different sizes can then function as etch masks to transfer patterns into one or more underlying layers. Accordingly, structures having differing critical dimensions can be fabricated at sub-resolution scales.

One example embodiment includes a method for processing a semiconductor substrate. This method includes positioning a substrate on a substrate holder in a plasma processing chamber. The substrate has a plurality of structures positioned on an underlying layer. The plurality of structures are comprised of either silicon and/or silicon nitride, with each structure having an initial critical dimension. The substrate is then exposed to an oxygen-containing plasma in a plasma processing chamber such that exposed surfaces of structures becoming oxidized to a predetermined thickness into the structures, which results in a layer of oxide. A first portion of structures, from the plurality of structures, is masked with a protective mask such that a second portion of structures from the plurality of structures is free from the protective mask. The layer of oxide is then removed from structures in the second portion of structures using a chemical oxide removal process that results in the second portion of structures having a resulting critical dimension that is less than the initial critical dimension. In other embodiments, masking can be executed prior to plasma oxidation so that only a portion of structures become oxidized with a layer of oxide. This layer of oxide can then be removed by chemical oxide removal either before or after removal of the mask.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Techniques herein use a plasma oxidation treatment to modify a material to a predetermined thickness around a mandrel or spacer or other structure (permanent or sacrificial). This plasma oxidation is then followed by a chemical oxide removal treatment (gaseous, plasma-free etch). With only a portion of the structures being oxidized— or by covering a portion of oxidized structures—the chemical oxide removal treatment essentially shrinks only a portion of the structures thereby yielding structures having differing critical dimensions which can function as etch masks to transfer patterns into one or more underlying layers. Accordingly, structures having differing critical dimensions can be fabricated at sub-resolution scales, that is, at dimensions smaller than what conventional photolithography systems can print.

Figure 1:
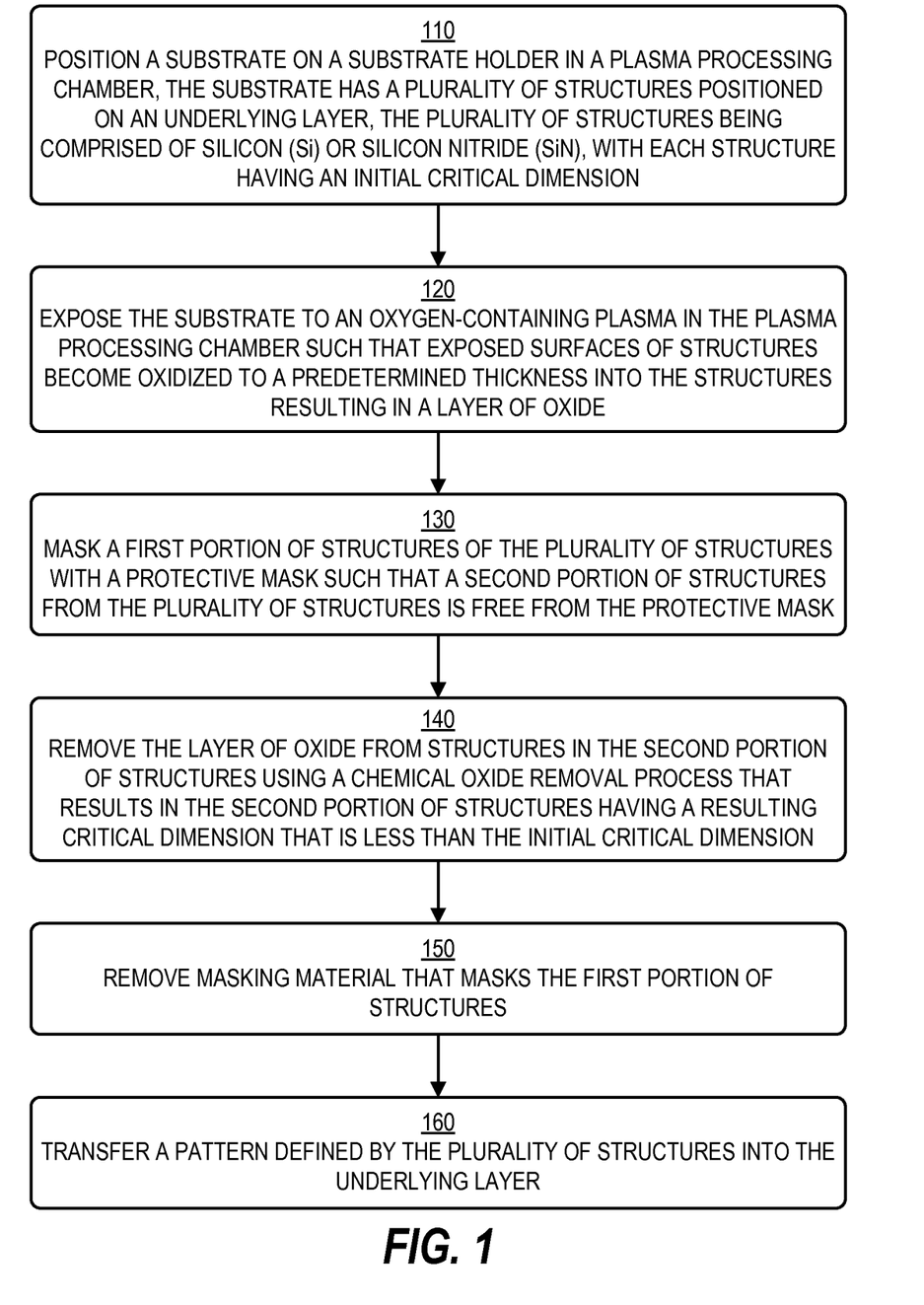
FIG. 1 is a flow chart of a method for patterning a substrate according to techniques disclosed herein.
Figure 2A:
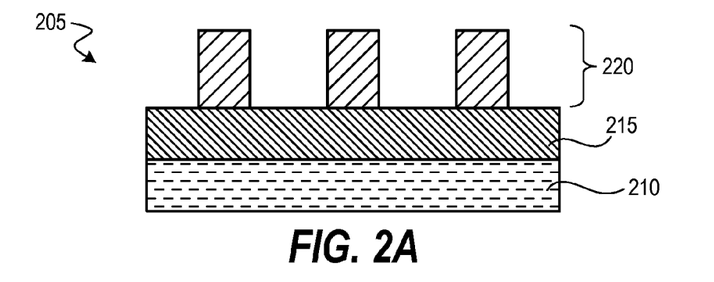
FIGS. 2A-2H are schematic diagrams of cross-sectional segments showing stages of patterning methods as disclosed herein.

Referring now to FIGS. 1 and 2A-2G, an example method for patterning substrates is generally shown. In step 110, a substrate is positioned on a substrate holder in a plasma processing chamber. Plasma processing chambers are generally known, and an example plasma processing chamber will be described below. The substrate has a plurality of structures positioned on an underlying layer. FIG. 2A shows an example cross-sectional segment of substrate 205. Substrate 205 shows structures 220 positioned on the underlying layer 215. Also shown is second underlying layer 210. Note that each of the underlying layers can be comprised of one or more layers. Structures 220 are shown defining a relief pattern or topographic pattern such that some portions of underlying layer 215 are covered while other portions of an underlying layer 215 remain uncovered. By way of a non-limiting example, structures 220 can define a pattern for etching the fin and/or gate structures. Substrate 205 can be, for example, a semiconductor substrate or wafer. The plurality of structures is comprised of silicon (Si) and/or silicon nitride (SiN), with each structure having an initial critical dimension. Other materials can be selected that react to oxygen radicals or ions by forming a layer of oxide.

Figure 2B:
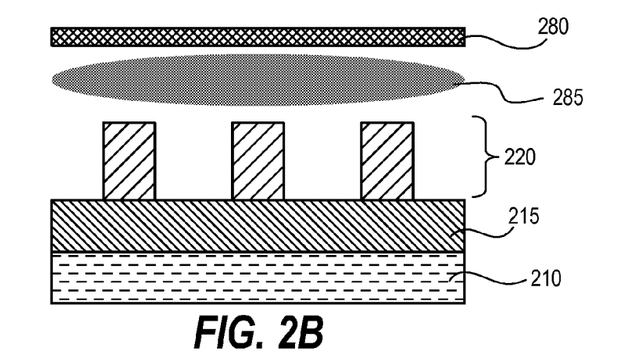
Figure 2C:
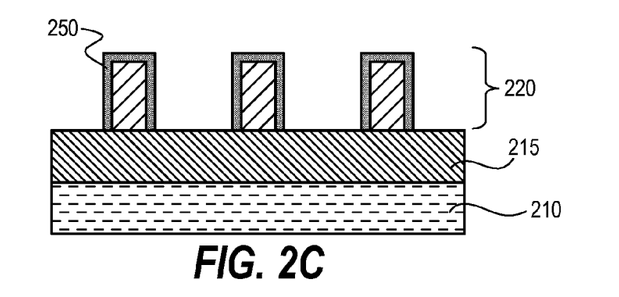

In step 120, a substrate 205 is exposed to an oxygen-containing plasma 285 in a plasma processing chamber as shown in FIG. 2B. In this example an upper electrode 280 of a given plasma processing system is illustrated. The substrate 205 is exposed to plasma 285 such that exposed surfaces of structures becoming oxidized to a predetermined thickness into the structures 220 resulting in a layer of oxide 250. An example result of such a plasma oxidation technique is shown in FIG. 2C. Note that layer of oxide 250 is essentially grown into structures 220, which can be contrasted with oxide depositions in which a given structure increases in a given critical dimension or width. With the plasma oxidation process as disclosed herein, there may be some minor, negligible increase in structure width that is generally insubstantial to subsequent fabrication processes. The oxide layer 250 essentially grows into structures 220 to some predetermined depth, distance, or thickness. In other words, an exterior portion of exposed silicon or silicon nitride surfaces become modified or transformed into an oxide material. Note that oxide layer 250 can be formed equally well on horizontal and vertical surfaces. This can be accomplished in part by using a generally isotropic oxygen plasma treatment. In other words, the silicon or silicon nitride materials are modified to become an oxide or oxide-like material using the plasma oxidation process. Exposing the substrate to the oxygen-containing plasma can include maintaining a plasma in a plasma processing chamber from a flow of oxygen-containing gas such that products from the plasma chemically modify exposed surfaces of the plurality of structures. In one example embodiment, the oxygen-containing gas is substantially $O_2$. Other oxygen-containing gases that can be used include CO and $CO_2$. Depending on a given application and processing parameters, using CO or $CO_2$ can potentially result in some carbon deposition which may be undesirable for a particular material scheme, in which case using pure oxygen may be preferred. A carrier gas may also be used with the oxidizing gas such as He or Ar.

The predetermined depth to which the layer of oxide 250 is formed can be controlled by controlling one or more plasma processing parameters. Such parameters can include, for example, duration of plasma exposure, oxygen flow rate, pressure, temperature, radio frequency power, and so forth. For example, having a relatively low chamber pressure can increase plasma oxidation rates. Likewise, a relatively higher temperature can also increase plasma oxidation rates. A type of plasma processing system selected can also affect oxide layer growth rates. For example, plasma generated using surface wave plasma generated using a slotted antenna and microwave power can generate plasma that is denser as compared to plasmas from other plasma generation systems. Having an increased plasma density can contribute to faster oxidation rates.

Figure 2D:
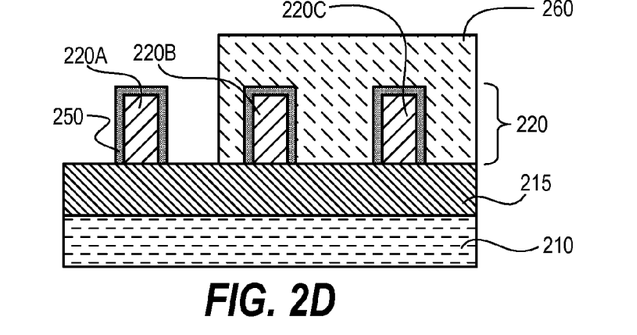

In step 130, a first portion of structures of the plurality of structures is masked with a protective mask such that a second portion of structures from the plurality of structures is free from the protective mask. In other words, a masking process is executed that results in a portion of the structures being covered (surrounded) with a mask. Masking a portion of structures can involve conventional lithographic masking and development techniques. In some embodiments, masking can involve covering the entire substrate with a thin film, exposing the substrate to a lithographic pattern and then developing/removing portions of the thin film such that a desired portion of structures are not covered by the mask. FIG. 2D shows an example result of masking a first portion of structures. Note that mask 260 covers (protects) structures 220B and 220C, while structure 220A is uncovered or exposed in this example segment.

Figure 2E:
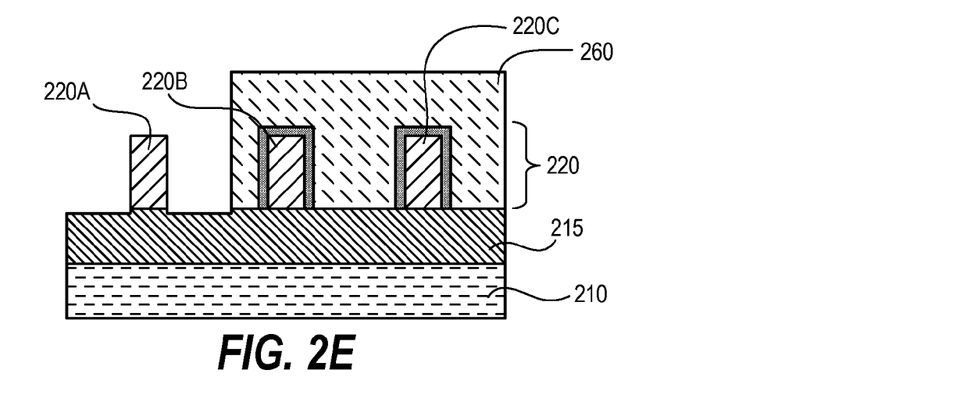

In step 140, the layer of oxide 250 is removed from structures in the second portion of structures using a chemical oxide removal process that results in the second portion of structures having a resulting critical dimension that is less than the initial critical dimension. An example result is shown in FIG. 2E. Note that oxide layer 250 has been removed from structure 220A. As a consequence, structure 220A has a critical dimension or width that is less than the critical dimension of structures 220 from FIG. 2A. Chemical oxide removal techniques and systems are known. Such techniques generally involve using a gaseous, plasma-free and damage-free etch that removes oxide and oxide-like materials with a very high selectivity to other materials such as nitride, photoresists, and silicon materials. Various conventionally available substrate cleaning tools can be used for such a chemical oxide removal. An example chemical oxide removal uses a mixture of HF (hydrogen fluoride) and NH3 (ammonia) in a ratio of approximately 2:1, with a reaction carried out at pressures below 15 mTorr at 25 C to form solid ammonium hexafluorosilicate, followed by evaporation at a temperature over 100 C. Such chemical oxide removal enables precise trim. Thus, with mask 260 comprised of a photoresist material, such a mask would prevent chemical oxide removal of oxide layer 250 from structures covered by the mask. In some embodiments, underlying layer 215 can also be an oxide material. If this underlying layer is oxide, then there may be some removal of that layer, but the removal amount from the underlying layer is relatively small and typically negligible because the removal is in the vertical direction and thus does not affect line widths. Moreover, portions of underlying layer 215 that are oxidized and removed are often portions that will be etched away in subsequent fabrication steps.

Figure 2F:
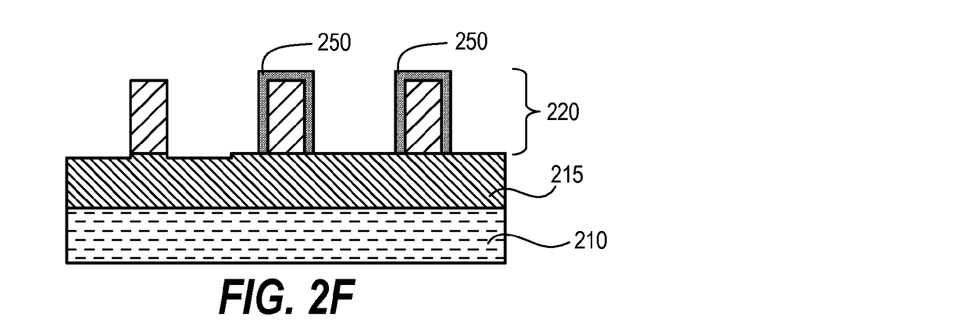
Figure 2G:
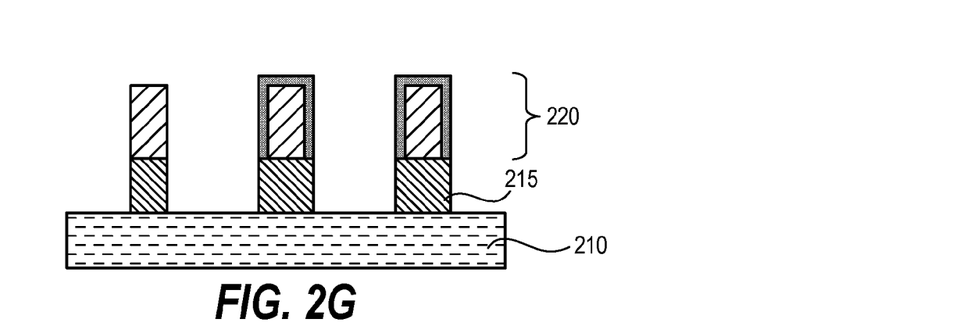
Figure 2H:
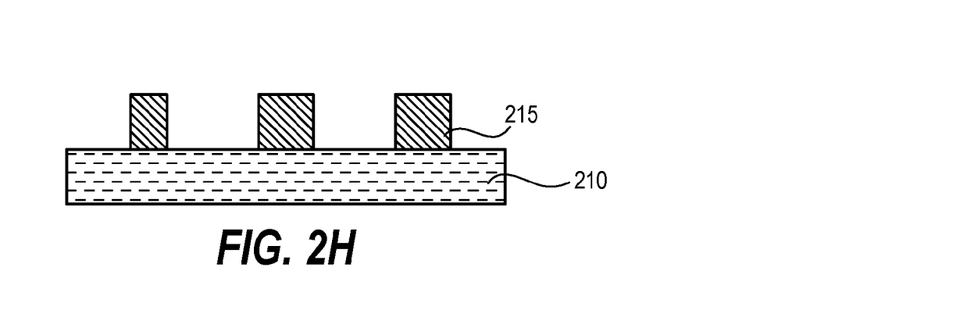

In step 150, the masking material that masks the first portion of structures is removed. Removal can be accomplished using various techniques such as an ashing process. FIG. 2F shows a result of an example substrate segment after removal of mask 260. Note that the result is that structures define a mask pattern having differing critical dimensions. For example, structures having the oxide layer 250 removed can have a smaller critical dimension or width as compared to structures that still retain the oxide layer 250, or were never oxidized during plasma oxidation. In step 160, the pattern defined by plurality of structures 220 can be transferred into the underlying layer 215 via one or more etch processes, such as a reactive ion etch process. FIG. 2G shows an example result after pattern transfer. FIG. 2H shows a pattern defined by underlying layer 215 after structures 220 have been removed from substrate 205. As can be observed, transferring the pattern results in defining structures (such as gate structures) having different critical dimensions.

Figure 3A:
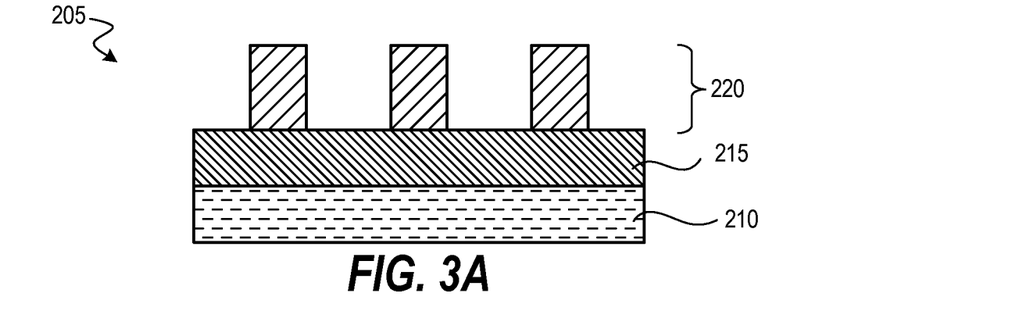
FIGS. 3A-3H are schematic diagrams of cross-sectional segments showing stages of patterning methods as disclosed herein.

FIGS. 3A-3H illustrate an alternative embodiment of techniques herein. FIG. 3A is similar to FIG. 2A. A substrate is provided or received having a plurality of structures 220 positioned on an underlying layer 215. The plurality of structures 220 are comprised of silicon or silicon nitride or another material that can generate layer of oxide in a plasma oxygen environment. Each structure has an initial critical dimension. For convenience in describing embodiments herein, structures within the plurality of structures 220 can be considered to have a same initial critical dimension.

Figure 3B:
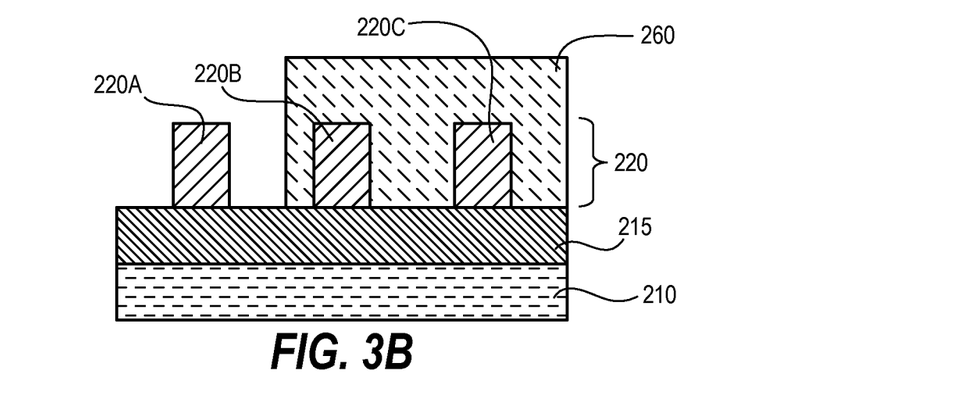
Figure 3C:
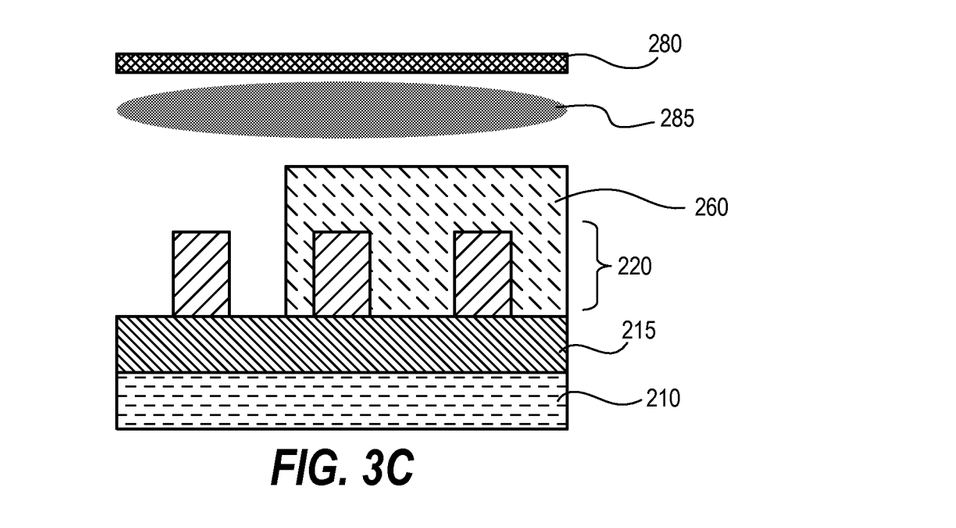

In FIG. 3B, the first portion of structures from the plurality of structures 220 is masked with a protective mask such that a second portion of structures from the plurality of structures is free from the protective mask. Note that mask 260 covers structures 220B and 220C, while structure 220A remains uncovered or unmasked. Note that if such masking is executed using conventional masking techniques then structure 220A may have been temporarily covered and then uncovered during the masking process. This masking can occur prior to any plasma oxidation treatment.

Figure 3D:
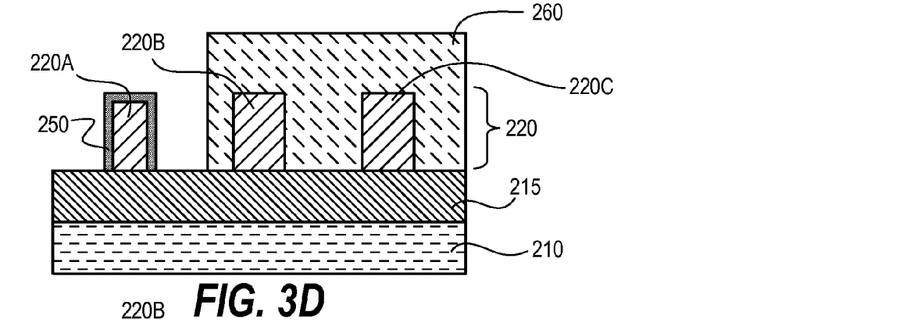
Figure 3E:
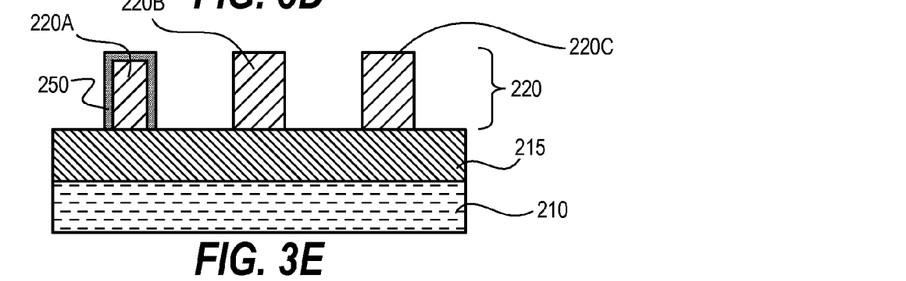

After a portion of the structures have been masked, the substrate is exposed to an oxygen-containing plasma in a plasma processing chamber such that exposed surfaces of structures from the second portion of structures become oxidized to a predetermined thickness or depth into structures from the second portion of structures resulting in a layer of oxide on the second portion of structures. FIG. 3D shows that structure 220A now has an oxide layer 250. Structures 220B and 220C do not have an oxide layer because the structures were protected during the plasma oxidation process. Mask 260 can then be removed from substrate 205. FIG. 3E shows a result of a portion of structures (220A) having a layer of oxide 250 while a remaining portion (220B and 220C) remains unmodified.

Figure 3F:
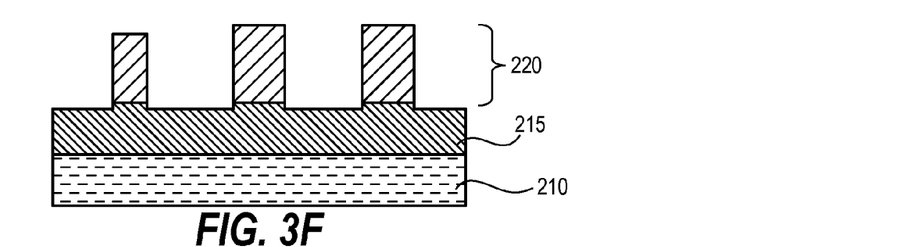
Figure 3G:
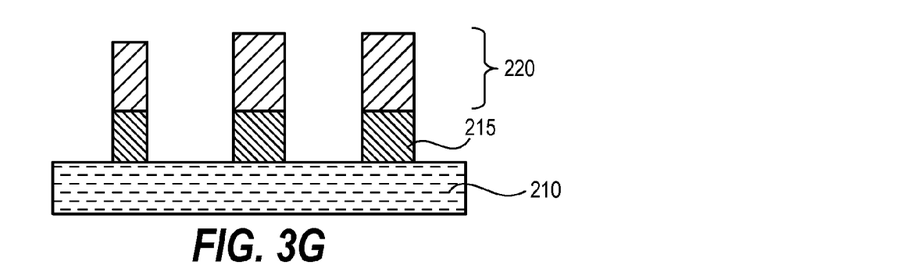
Figure 3H:
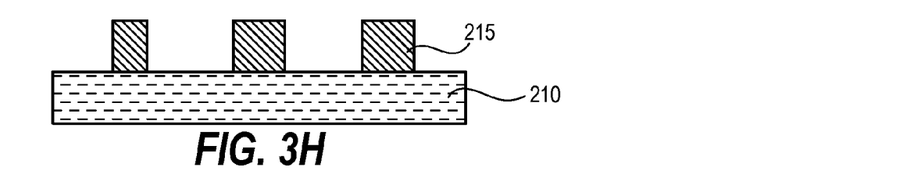

Layer of oxide 250 can now be removed from structures in the second portion of structures using a chemical oxide removal (COR) process that results in the second portion of structures having a resulting critical dimension that is less than the initial critical dimension. Example results are illustrated in FIG. 3F. The resulting pattern now defined by structures 220—having varied critical dimensions—can now be transferred into underlying layer 215 (FIG. 3G), and then structures 220 can be removed from substrate 205 (FIG. 3H). Note that in this example patterning sequence mask 260 was removed prior to chemical oxide removal but subsequent to the second portion of structures becoming oxidized. Alternatively, mask 260 can be removed subsequent to removing the layer of oxide from structures in the second portion of structures. In certain embodiments it can be beneficial to remove mask 260 prior to chemical oxide removal because a same plasma processing system that oxidizes a portion of structures can also be used to remove mask 260, such as by using an ashing process.

Figure 4A:
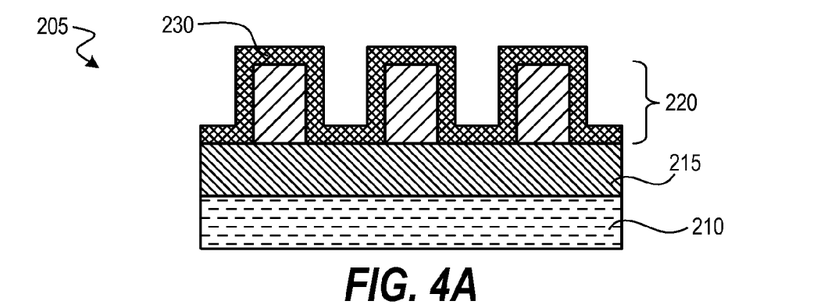
FIGS. 4A-4I are schematic diagrams of cross-sectional segments showing stages of patterning methods as disclosed herein.
Figure 4B:
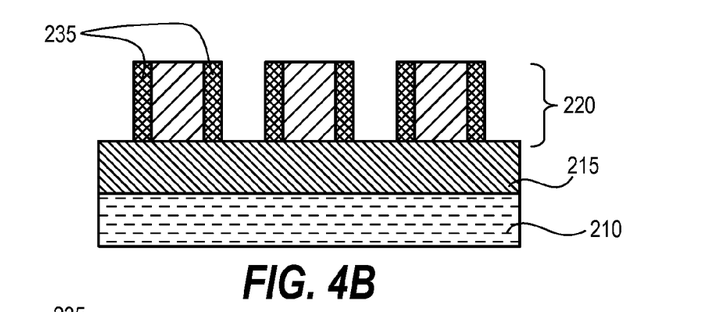

FIGS. 4A-3H and 4J illustrate an alternative embodiment of techniques herein. A substrate is positioned on a substrate holder in a plasma processing chamber. The substrate has a plurality of structures 220 positioned on an underlying layer 215. The plurality of structures includes silicon nitride sidewall spacers 235 formed on a mandrel with each structure having an initial critical dimension. Silicon nitride sidewall spacers 235, as shown in FIG. 4B, can be created by anisotropically etching the conformal silicon nitride film 230, as shown in FIG. 4A.

Figure 4C:
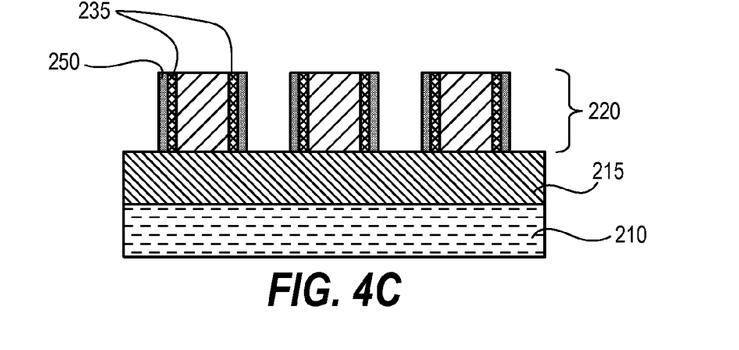
Figure 4D:
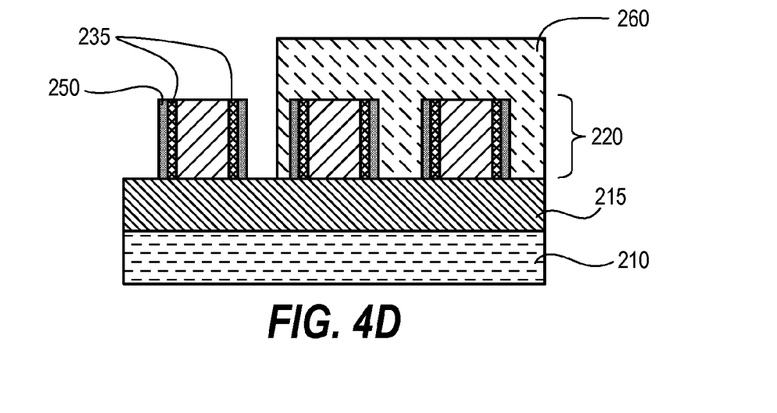
Figure 4E:
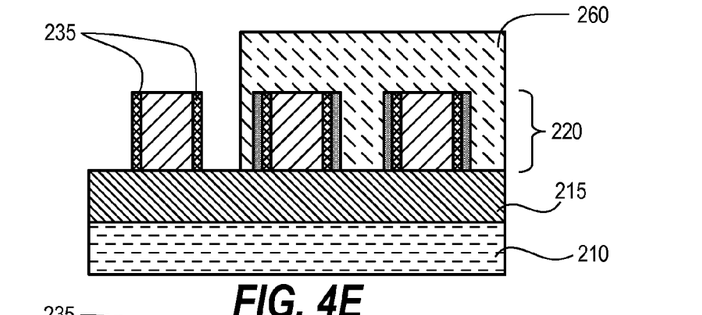
Figure 4F:
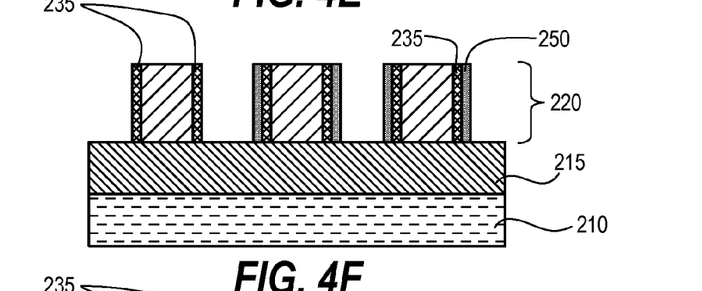
Figure 4G:
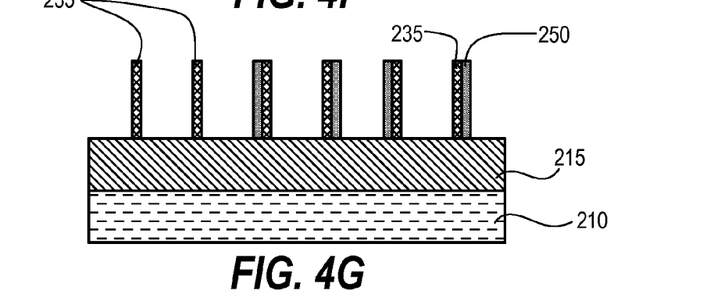
Figure 4H:
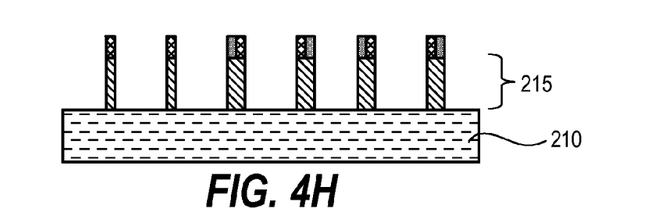
Figure 4I:
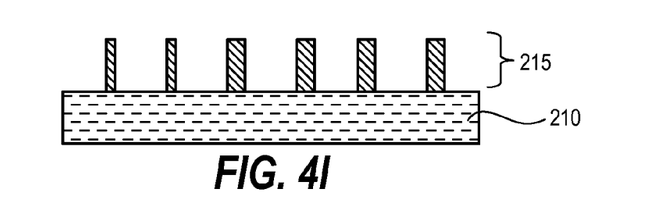

The substrate is exposed to an oxygen-containing plasma in the plasma processing chamber such that exposed surfaces of silicon nitride sidewall spacers 235 become oxidized to a predetermined thickness into the silicon nitride sidewall spacers, which results in a layer of oxide 250, as shown in FIG. 4C. The first portion of structures of the plurality of structures are masked with a protective mask 260, as shown in FIG. 4D. With mask 260 in place, the layer of oxide 250 is removed from silicon nitride sidewall spacers in the second portion of structures using a chemical oxide removal process (FIG. 4E). This chemical oxide removal process results in the second portion of structures having a resulting critical dimension that is less than the initial critical dimension. In other words, a portion of the silicon nitride sidewall spacers have been narrowed, as shown in FIG. 4F. FIG. 4F also shows mask 260 having been removed. In some embodiments, the plurality of structures 220 (functioning as mandrels) can be removed (FIG. 4G). A pattern defined by the silicon nitride sidewall spacers can be transferred into an underlying layer 215 (FIG. 4H). Some spacers may retain an initial critical dimension being comprised of both silicon nitride and a layer of oxide, while other silicon nitride spacers have a comparatively smaller critical dimension without the layer of oxide. After transferring the pattern, any remaining spacer or oxide material can be removed, yielding structures in underlying layer 215 having differing dimensions (FIG. 4J).

Depending on controllable plasma processing parameters, a thickness of oxide layer 250 can be varied from about 1 nm to several nanometers or more. Note that in any of the example embodiments, plasma oxidation, partial masking, and chemical oxide removal can be repeated two or more times on a given substrate prior to transferring a defined pattern into an underlying layer. For example, if a given plasma process system is capable of oxidizing 3 nm of a substrate, yet 6 nm per surface needs to be removed, then two plasma oxidation and chemical oxide removal cycles can be executed.

Figure 5:
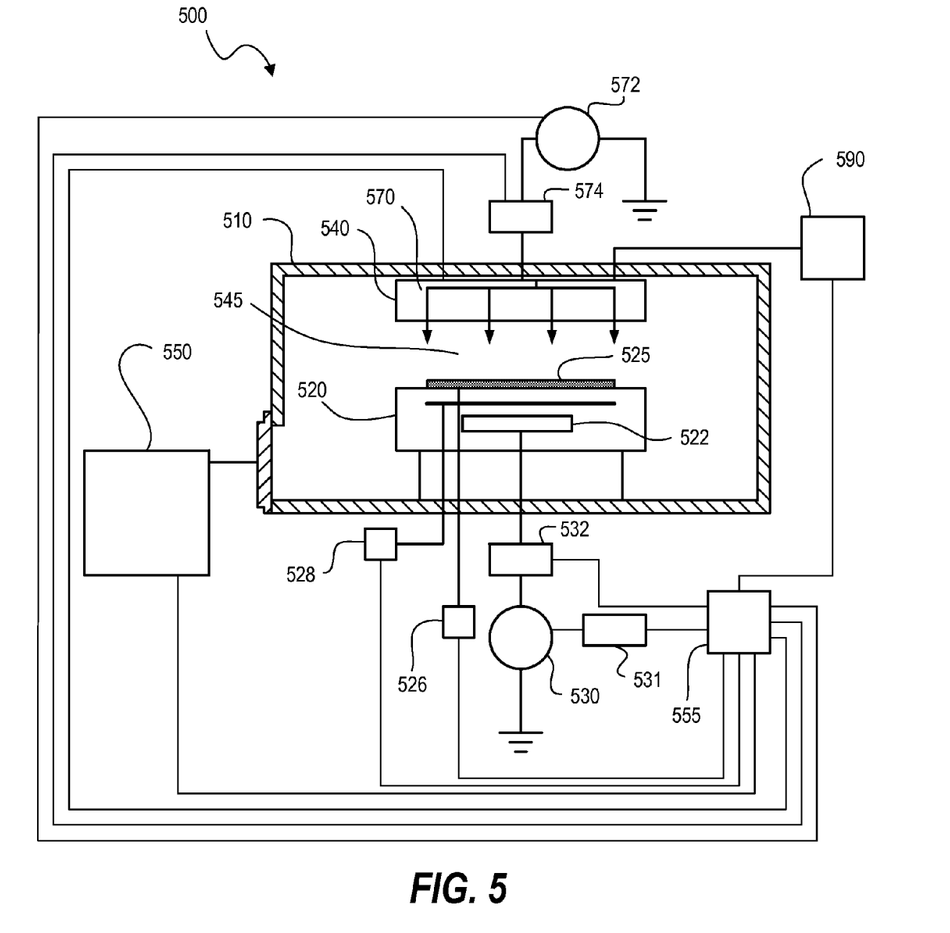
FIG. 5 is a schematic diagram of a plasma processing system according to embodiments herein.

Various different conventional plasma processing systems can be used for process steps of oxidation, deposition and etching. One or more of the methods for performing a plasma oxidation process and etch transfer process sequence according to various embodiments described above may be performed in any one of various conventional plasma processing systems. FIG. 5 illustrates one example plasma processing system 500. Plasma processing system 500 is configured to perform the above-identified process condition, and includes a plasma processing chamber 510, substrate holder 520, upon which a substrate 525 to be processed is affixed, and vacuum pumping system 550. Substrate 525 can be a semiconductor substrate, a wafer, a flat panel display, or a liquid crystal display. Plasma processing chamber 510 can be configured to facilitate the generation of plasma in plasma processing region 545 in the vicinity of a surface of substrate 525. An ionizable gas or mixture of process gases is introduced via a gas distribution system 540. For a given flow of process gas, the process pressure is adjusted using the vacuum pumping system 550. Plasma can be utilized to create materials specific to a pre-determined materials process, and/or to aid the removal of material from the exposed surfaces of substrate 525. The plasma processing system 500 can be configured to process substrates of any desired size, such as 200 mm substrates, 300 mm substrates, 450 mm or larger.

Substrate 525 can be affixed to the substrate holder 520 via a clamping system 528, such as a mechanical clamping system or an electrical clamping system (e.g., an electrostatic clamping system). Furthermore, substrate holder 520 can include a heating system (not shown) or a cooling system (not shown) that is configured to adjust and/or control the temperature of substrate holder 520 and substrate 525. The heating system or cooling system may comprise a re-circulating flow of heat transfer fluid that receives heat from substrate holder 520 and transfers heat to a heat exchanger system (not shown) when cooling, or transfers heat from the heat exchanger system to substrate holder 520 when heating. In other embodiments, heating/cooling elements, such as resistive heating elements, or thermo-electric heaters/coolers can be included in the substrate holder 520, as well as the chamber wall of the plasma processing chamber 510 and any other component within the plasma processing system 500.

Additionally, a heat transfer gas can be delivered to the backside of substrate 525 via a backside gas supply system 526 in order to improve the gas-gap thermal conductance between substrate 525 and substrate holder 520. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 525.

Substrate holder 520 can comprise an electrode 522 through which RF power is coupled to the processing plasma in plasma processing region 545. For example, substrate holder 520 can be electrically biased at a RF voltage via the transmission of RF power from a RF generator 530 through an optional impedance match network 532 to substrate holder 520. The RF electrical bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are known to those skilled in the art.

Furthermore, the electrical bias of electrode 522 at a RF voltage may be pulsed using pulsed bias signal controller 531. The RF power output from the RF generator 530 may be pulsed between an off-state and an on-state, for example. Alternately, RF power is applied to the substrate holder electrode at multiple frequencies. Furthermore, impedance match network 532 can improve the transfer of RF power to plasma in plasma processing chamber 510 by reducing the reflected power. Match network topologies and automatic control methods are known to those skilled in the art.

Gas distribution system 540 may comprise a showerhead design for introducing a mixture of process gases. Alternatively, gas distribution system 540 may comprise a multi-zone showerhead design for introducing a mixture of process gases and adjusting the distribution of the mixture of process gases above substrate 525. For example, the multi-zone showerhead design may be configured to adjust the process gas flow or composition to a substantially peripheral region above substrate 525 relative to the amount of process gas flow or composition to a substantially central region above substrate 525.

Vacuum pumping system 550 can include a turbo-molecular vacuum pump (TMP) capable of a pumping speed up to about 5000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 510.

Controller 555 comprises a microprocessor, memory, and a digital I/O port capable of generating control voltages sufficient to communicate and activate inputs to plasma processing system 500 as well as monitor outputs from plasma processing system 500. Moreover, controller 555 can be coupled to and can exchange information with RF generator 530, pulsed bias signal controller 531, impedance match network 532, the gas distribution system 540, vacuum pumping system 550, as well as the substrate heating/cooling system (not shown), the backside gas supply system 526, and/or the electrostatic clamping system 528. For example, a program stored in the memory can be utilized to activate the inputs to the aforementioned components of plasma processing system 500 according to a process recipe in order to perform a plasma assisted process, such as a plasma etch process, on substrate 525.

Controller 555 can be locally located relative to the plasma processing system 500, or it can be remotely located relative to the plasma processing system 500. For example, controller 555 can exchange data with plasma processing system 500 using a direct connection, an intranet, and/or the internet. Controller 555 can be coupled to an intranet at, for example, a customer site (i.e., a device maker, etc.), or it can be coupled to an intranet at, for example, a vendor site (i.e., an equipment manufacturer). Alternatively or additionally, controller 555 can be coupled to the internet. Furthermore, another computer (i.e., controller, server, etc.) can access controller 555 to exchange data via a direct connection, an intranet, and/or the internet.

Plasma processing system 500 can further comprise either a stationary, mechanically, or electrically rotating magnetic field system (not shown) to potentially increase plasma density and/or improve plasma processing uniformity. Moreover, controller 555 can be coupled to a magnetic field system to regulate the speed of rotation and field strength. The design and implementation of a rotating magnetic field is well known to those skilled in the art.

Plasma processing system 500 can further comprise an upper electrode 570 to which RF power can be coupled from RF generator 572 through optional impedance match network 574. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 555 is coupled to RF generator 572 and impedance match network 574 in order to control the application of RF power to upper electrode 570. The design and implementation of an upper electrode is known to those skilled in the art. The upper electrode 570 and the gas distribution system 540 can be designed within the same chamber assembly, as shown. Alternatively, upper electrode 570 may comprise a multi-zone electrode design for adjusting the RF power distribution coupled to plasma above substrate 525. For example, the upper electrode 570 may be segmented into a center electrode and an edge electrode.

Plasma processing system 500 can further comprise a direct current (DC) power supply 550 coupled to the upper electrode 570 opposing substrate 525. The upper electrode 570 may comprise an electrode plate. The electrode plate may comprise a silicon-containing electrode plate. Moreover, the electrode plate may comprise a doped silicon electrode plate. The DC power supply 550 can include a variable DC power supply. Additionally, the DC power supply 550 can include a bipolar DC power supply. The DC power supply 550 can further include a system configured to perform at least one of monitoring, adjusting, or controlling the polarity, current, voltage, or on/off state of the DC power supply 550. Once plasma is formed, the DC power supply 550 facilitates the formation of a ballistic electron beam. An electrical filter (not shown) may be utilized to de-couple RF power from the DC power supply 550.

For example, the DC voltage applied to upper electrode 570 by DC power supply 550 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 570. The surface of the upper electrode 570 facing the substrate holder 520 may be comprised of a silicon-containing material.

Other types of known plasma processing systems can also be used to execute techniques disclosed herein. For example, alternate plasma processing systems (not shown) further comprise an inductive coil to which RF power is coupled via an RF generator through an optional impedance match network. RF power is inductively coupled from the inductive coil through a dielectric window to the plasma processing region. A frequency for the application of RF power to the inductive coil can range from about 10 MHz to about 100 MHz. Similarly, a frequency for the application of power to the chuck electrode can range from about 0.1 MHz to about 100 MHz. In addition, a slotted Faraday shield can be employed to reduce capacitive coupling between the inductive coil and plasma in the plasma processing region. Moreover, a controller can be coupled to the RF generator and the impedance match network to control the application of power to the inductive coil.

In an alternate embodiment, a plasma processing system can comprise an inductive coil that is a "spiral" coil or "pancake" coil in communication with the plasma processing region from above as in a transformer-coupled plasma (TCP) reactor. The design and implementation of an inductively-coupled plasma (ICP) source, or transformer coupled plasma (TCP) source, is well known to those skilled in the art. Alternately, plasma can be formed using electron cyclotron resonance (ECR). In yet another embodiment, the plasma is formed from the launching of a Helicon wave. In yet another embodiment, the plasma is formed from a propagating surface wave. Other plasma processing systems can be similar to the embodiment of FIG. 5, and can further comprise a surface wave plasma (SWP) source. The SWP source can comprise a slot antenna, such as a radial line slot antenna, to which microwave power is coupled via a power coupling system. Each plasma source described above is well known to those skilled in the art.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to the object being processed in accordance with the invention. The substrate may include any material portion or structure of a device, particularly a semiconductor or other electronics device, and may, for example, be a base substrate structure, such as a semiconductor wafer, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for processing a semiconductor substrate, the method comprising:
    positioning a substrate on a substrate holder in a plasma processing chamber, the substrate having a plurality of structures positioned on an underlying layer, the plurality of structures being comprised of silicon (Si) or silicon nitride (SiN), with each structure having an initial critical dimension;
    exposing the substrate to an oxygen-containing plasma in the plasma processing chamber such that exposed surfaces of structures become oxidized to a predetermined thickness into the structures resulting in a layer of oxide;
    masking a first portion of structures of the plurality of structures with a protective mask such that a second portion of structures from the plurality of structures is free from the protective mask; and
    removing the layer of oxide from structures in the second portion of structures using a gaseous chemical oxide removal process that results in the second portion of structures having a resulting critical dimension that is less than the initial critical dimension.

2. The method of claim 1, further comprising:
    removing masking material that masks the first portion of structures.

3. The method of claim 2, further comprising:
    transferring a pattern defined by the plurality of structures into the underlying layer.

4. The method of claim 3, wherein the plurality of structures defines a pattern for etching transistor gate structures.

5. The method of claim 4, wherein transferring the pattern results in defining gate structures having different critical dimensions.

6. The method of claim 1, wherein exposing the substrate to the oxygen-containing plasma includes maintaining a plasma in the plasma processing chamber from a flow of oxygen-containing gas such that products from the plasma chemically modify exposed surfaces of the plurality of structures.

7. The method of claim 6, wherein the oxygen-containing gas is substantially $O_2$.

8. The method of claim 1, wherein the predetermined thickness is based on plasma processing parameters.

9. The method of claim 1, wherein removing the layer of oxide from structures in the second portion of structures includes using a gaseous oxide etch cleaning process.

10. The method of claim 1, wherein masking the first portion of structures includes depositing a layer of photoresist, patterning the photoresist, and developing soluble portions of the photoresist.

11. The method of claim 1, wherein removing the layer of oxide from structures in the second portion of structures includes using a gaseous oxide etch cleaning process; and
    wherein masking the first portion of structures includes depositing a layer of photoresist, patterning the photoresist, and developing soluble portions of the photoresist.

12. A method for processing a semiconductor substrate, the method comprising:
    providing a substrate having a plurality of structures positioned on an underlying layer, the plurality of structures being comprised of silicon (Si) or silicon nitride (SiN), with each structure having an initial critical dimension;
    masking a first portion of structures from the plurality of structures with a protective mask such that a second portion of structures from the plurality of structures is free from the protective mask;
    exposing the substrate to an oxygen-containing plasma in a plasma processing chamber such that exposed surfaces of structures from the second portion of structures become oxidized to a predetermined thickness into structures from the second portion of structures resulting in a layer of oxide on the second portion of structures; and
    removing the layer of oxide from structures in the second portion of structures using a chemical oxide removal process that results in the second portion of structures having a resulting critical dimension that is less than the initial critical dimension.

13. The method of claim 12, further comprising:
    removing masking material that masks the first portion of structures.

14. The method of claim 13, wherein masking material is removed subsequent to the second portion of structures become oxidized and prior to removing the layer of oxide from structures in the second portion of structures.

15. The method of claim 13, wherein masking material is removed subsequent to removing the layer of oxide from structures in the second portion of structures.

16. The method of claim 13, further comprising:
    transferring a pattern defined by the plurality of structures into the underlying layer.

17. The method of claim 16, wherein the plurality of structures defines a pattern for etching transistor gate structures, and wherein transferring the pattern results in defining gate structures having different critical dimensions.

18. The method of claim 12, wherein exposing the substrate to the oxygen-containing plasma includes maintaining a plasma in the plasma processing chamber from a flow of oxygen-containing gas that is substantially $O_2$ such that products from the plasma chemically modify exposed surfaces of the plurality of structures.

19. A method for processing a semiconductor substrate, the method comprising:
    positioning a substrate on a substrate holder in a plasma processing chamber, the substrate having a plurality of structures positioned on an underlying layer, the plurality of structures including silicon nitride sidewall spacers formed on a mandrel, with each structure having an initial critical dimension;
    exposing the substrate to an oxygen-containing plasma in the plasma processing chamber such that exposed surfaces of silicon nitride sidewall spacers become oxidized to a predetermined thickness into the silicon nitride sidewall spacers resulting in a layer of oxide;
    masking a first portion of structures of the plurality of structures with a protective mask such that a second portion of structures from the plurality of structures is free from the protective mask; and removing the layer of oxide from silicon nitride sidewall spacers in the second portion of structures using a chemical oxide removal process that results in the second portion of structures having a resulting critical dimension that is less than the initial critical dimension.

20. The method of claim 19, further comprising:

removing masking material that masks the first portion of structures;

removing each mandrel; and transferring a pattern defined by the silicon nitride sidewall spacers into the underlying layer.

\* \* \* \* \*